(12) United States Patent
Chae et al.

(10) Patent No.: US 9,515,215 B2
(45) Date of Patent: Dec. 6, 2016

(54) EFFICIENCY RESTORATION IN A PHOTOVOLTAIC CELL

(71) Applicant: International Business Machines Corporation, Armonk, NY (US)

(72) Inventors: Young T. Chae, Yorktown Heights, NY (US); Augustin J. Hong, White Plains, NY (US); Jeehwan Kim, Los Angeles, CA (US); Young M. Lee, Old Westbury, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 197 days.

(21) Appl. No.: 14/027,657

(22) Filed: Sep. 16, 2013

(65) Prior Publication Data

US 2014/0014162 A1    Jan. 16, 2014

Related U.S. Application Data

(62) Division of application No. 13/271,357, filed on Oct. 12, 2011, now abandoned.

(51) Int. Cl.
| | |
|---|---|
| H01L 31/058 | (2006.01) |
| H01L 31/0525 | (2014.01) |
| H01L 31/0376 | (2006.01) |
| H02S 40/44 | (2014.01) |
| F24J 2/50 | (2006.01) |
| F28F 1/32 | (2006.01) |

(52) U.S. Cl.
CPC ....... *H01L 31/058* (2013.01); *H01L 31/03767* (2013.01); *H02S 40/44* (2014.12); *F24J 2/50* (2013.01); *F28F 1/32* (2013.01); *Y02E 10/50* (2013.01); *Y02E 10/60* (2013.01)

(58) Field of Classification Search
CPC ................................. H01L 31/058; F24J 2/42
See application file for complete search history.

(56) References Cited

U.S. PATENT DOCUMENTS

| | | |
|---|---|---|
| 4,064,521 A | 12/1977 | Carlson |
| 4,314,547 A | 2/1982 | Walsh |

(Continued)

OTHER PUBLICATIONS

U.S. Office Action dated Mar. 3, 2014 issued in U.S. Appl. No. 13/607,679.

(Continued)

*Primary Examiner* — Matthew Martin
*Assistant Examiner* — Bethany L Martin
(74) *Attorney, Agent, or Firm* — Scully, Scott, Murphy & Presser, P.C.; Louis J. Percello, Esq.

(57) ABSTRACT

The electrical output efficiency of a photovoltaic thermal system can be restored from degradation due to light exposure by annealing a photovoltaic thermal cell at an elevated temperature. The elevated temperature at the photovoltaic thermal cell can be provided by redirecting the flow of a heat exchange fluid to bypass a heat exchanger unit. A boiler unit may be employed to provide additional heating of the heat exchange fluid during the anneal. Further, a variable configuration lid can be provided over a front surface of the photovoltaic thermal cell to control ventilation over the front surface. During the anneal, the position of the variable configuration lid can be set so as to trap heat above the front surface and to elevate the anneal temperature further.

9 Claims, 11 Drawing Sheets

(56) References Cited

U.S. PATENT DOCUMENTS

| | | |
|---|---|---|
| 4,371,738 A | 2/1983 | Staebler |
| 2009/0159076 A1 | 6/2009 | Zheng |
| 2009/0223511 A1 | 9/2009 | Cox |
| 2011/0315192 A1 | 12/2011 | Swatek et al. |
| 2012/0067338 A1 | 3/2012 | Funcheon |

OTHER PUBLICATIONS

Office Action dated Oct. 16, 2013 received in a related U.S. Patent Application, namely U.S. Appl. No. 13/607,679.

Kalogirou, S.A., et al., "Hybrid PV/T solar systems for domestic hot water and electricity production" Energy Conversion & Management (Jan. 2006) pp. 3368-3382, vol. 47.

Akhtar, N, et al., "Computation of glass-cover temperatures and top heat loss coefficient of flat-plate solar collectors with double glazing" Energy (Jul. 2006) pp. 1067-1074, vol. 32.

Staebler, D. L., "Reversible conductivity changes in discharge-produced amorphous Si" Applied Physics Letters (Aug. 15, 1977) pp. 292-294, vol. 31, No. 4.

EFFICIENCY RESTORATION IN A PHOTOVOLTAIC CELL

CROSS REFERENCE TO RELATED APPLICATION

This application is a divisional of U.S. patent application Ser. No. 13/271,357, filed Oct. 12, 2011 the entire content and disclosure of which is incorporated herein by reference.

BACKGROUND

The present disclosure generally relates to a photovoltaic thermal (PVT) system, and particularly to a photovoltaic thermal system configured to restore the electrical output efficiency of a photovoltaic thermal cell through a thermal anneal, and a method of operating the photovoltaic thermal system.

A photovoltaic cell is a device that converts light directly into electricity by the photovoltaic effect. Assemblies of photovoltaic cells are used to make solar panels, solar modules, or photovoltaic arrays. A photovoltaic cell can be formed by providing a large area p-n junction in a semiconductor material.

A photovoltaic thermal (PVT) cell employing a thin film of amorphous silicon material is capable of generating thermal output in addition to electricity because the amorphous silicon material heats up significantly during exposure to radiation, which can be solar radiation. The electrical output efficiency, i.e., the efficiency of the electrical output excluding the thermal output, of a photovoltaic thermal cell employing an amorphous silicon material can be enhanced by hydrogenating the amorphous silicon material. The electrical output efficiency of such a photovoltaic thermal cell degrades in time, however, with the light soaking time, i.e., the time of exposure to radiation. For example, the electrical output efficiency of a photovoltaic thermal cell can decrease by about 10% within 3-4 hours from the maximum electrical output efficiency. The loss in the electrical output efficiency of a photovoltaic thermal cell employing a thin film of amorphous silicon material can eventually saturate at about 20% after about 60 hours of operation.

However, it is necessary to alleviate or circumvent the loss in the electrical output efficiency in a photovoltaic thermal cell in order to improve economic viability of the photovoltaic thermal cell.

SUMMARY

The electrical output efficiency of a photovoltaic thermal system can be restored from degradation due to light exposure by annealing a photovoltaic thermal cell at an elevated temperature. The elevated temperature at the photovoltaic thermal cell can be provided by redirecting the flow of a heat exchange fluid to bypass a heat exchanger unit. A boiler unit may be employed to provide additional heating of the heat exchange fluid during the anneal. Further, a variable configuration lid can be provided over a front surface of the photovoltaic thermal cell to control ventilation over the front surface. During the anneal, the position of the variable configuration lid can be set so as to trap heat above the front surface and to elevate the anneal temperature further.

According to an aspect of the present disclosure, a photovoltaic thermal (PVT) system is provided, which includes: a photovoltaic thermal (PVT) cell configured to generate electricity and to provide a thermal output; and at least one means for heating a photovoltaic material within the photovoltaic thermal cell to a temperature greater than 130 degrees Celsius for a duration of time.

According to another aspect of the present disclosure, a photovoltaic thermal (PVT) system is provided, which includes: a photovoltaic thermal (PVT) cell configured to generate electricity and to provide a thermal output; and a fluid circulation system that is configured to circulate a heat exchange fluid through at least two different circulation paths in different operational modes, wherein the at least two different circulation paths include a first circulation path including a pipe through the PVT cell and a pipe through a heat exchanger unit in which the heat exchange fluid loses heat, and a second circulation path that includes the pipe through the PVT cell and does not include the pipe through the heat exchanger unit.

According to yet another aspect of the present disclosure, a method of operating a photovoltaic thermal (PVT) system is provided, which includes: providing a photovoltaic thermal (PVT) system including a photovoltaic thermal (PVT) cell configured to generate electricity and to provide a thermal output; and annealing a photovoltaic material within the photovoltaic thermal cell at a temperature greater than 130 degrees Celsius for a duration of time.

According to still another aspect of the present disclosure, a method of operating a photovoltaic thermal (PVT) system is provided, which includes: providing a photovoltaic thermal (PVT) system including a photovoltaic thermal (PVT) cell configured to generate electricity and to provide a thermal output; and circulating a heat exchange fluid through at least two different circulation paths in different operational modes, wherein the at least two different circulation paths include a first circulation path including a pipe through the PVT cell and a pipe through a heat exchanger unit in which the heat exchange fluid loses heat, and a second circulation path that includes the pipe through the PVT cell and does not include the pipe through the heat exchanger unit.

DETAILED DESCRIPTION

Figure 1:
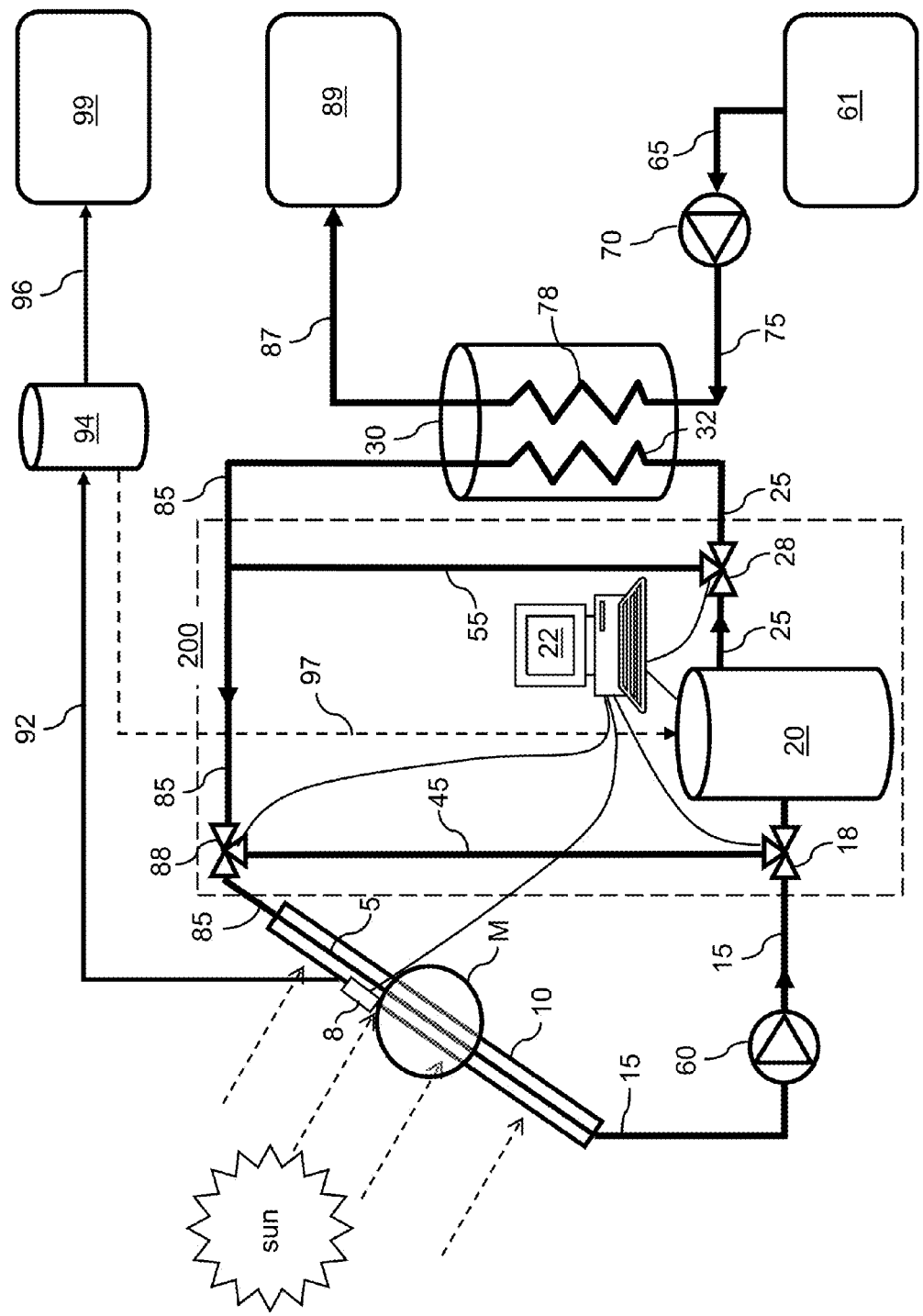
FIG. 1 is a schematic diagram of an exemplary photovoltaic thermal system according to an embodiment of the present disclosure.

As stated above, the present disclosure relates to a photovoltaic thermal system configured to restore the electrical output efficiency of a photovoltaic thermal cell through a thermal anneal, and a method of operating the photovoltaic thermal system, which are now described in detail with accompanying figures. Throughout the drawings, the same reference numerals or letters are used to designate like or equivalent elements. The drawings are not necessarily drawn to scale.

As used herein, a "photovoltaic material" refers to any material that generates a voltage difference between two terminals upon irradiation by electromagnetic radiation. The electromagnetic radiation can include the visible spectrum, the ultraviolet range, and the infrared range.

As used herein, a "thermal output" is an output provided as a heat exchange medium at one end of a circulation system at a temperature greater than ambient temperature to which the heat exchange medium is exposed at another end of the circulation system.

As used herein, a "photovoltaic thermal (PVT) cell" refers to a cell that is configured to generate electricity and a thermal output from radiation that impinges on the cell.

As used herein, a "photovoltaic thermal (PVT) system" refers to a system that includes at least one photovoltaic thermal cell and is configured to provide electricity and/or a thermal output from the at least one photovoltaic thermal cell.

Referring to FIG. 1, an exemplary photovoltaic thermal (PVT) system according to an embodiment of the present disclosure includes a photovoltaic thermal (PVT) cell 10 that is configured to generate electricity and a thermal output. At least one in-cell pipe 5 is located within the PVT cell 10. A heat exchange fluid, which can be a liquid or a gas, flows through the at least one in-cell pipe 5. The heat exchange fluid is guided into the at least one in-cell pipe 5 through a PVT cell inlet-side pipe 85, and is guided out of the at least one in-cell pipe 5 through a PVT cell outlet-side pipe 15. A circulation pump 60 can be located on a portion of the PVT cell inlet-side pipe 15 between the at least one in-cell pipe 5 and a first valve 18. Alternatively, the circulation pump 60 can be located on a portion of the PVT cell outlet-side pipe 85 between the at least one in-cell pipe 5 and a third valve 88.

The exemplary PVT system includes a heat exchanger unit 30, through which a first heat exchanger pipe 32 runs. The first heat exchanger pipe 32 is configured to enable circulation of the heat exchange fluid that flows through the PVT cell inlet-side pipe 85, the at least one in-cell pipe 5, and the PVT cell outlet-side pipe 15. For example, a heat exchanger inlet-side pipe 25 can be configured to take in the heat transfer fluid from the PVT cell inlet-side pipe 85, through a boiler unit 20, and to supply the heat transfer fluid into the PVT cell inlet-side pipe 85, which is also a heat exchanger outlet-side pipe.

A second heat exchange pipe 78 runs through the heat exchanger unit 30. The second heat exchanger pipe 78 can be connected to a cold water supply system 61 through a cold water supply pipe 75. A water supply pump 70 can be provided on the cold water supply pipe to feed cold water into the second heat exchange pipe 78 during generation of hot water, which is provided by heating the cold water that is supplied into the heat exchanger unit by transferring the heat in the heat exchange fluid in the first heat exchange pipe 32 into the water in the second heat exchange pipe 78. The first heat exchange pipe 32 and the second heat exchange pipe 78 are configured to enable effective heat transfer therebetween. Any configurations of two heat exchange pipes for effectively transferring heat as known in the art can be employed for the first heat exchange pipe 32 and the second heat exchange pipe 78 in the heat exchanger unit 30. The hot water flows through a hot water supply pipe 87 to hot water distribution control system 89, which distributes the hot water out of the hot water supply pipe 87 for any application requiring use of the hot water.

The exemplary PVT system includes a fluid circulation system that is configured to circulate the heat exchange fluid through at least two different circulation paths in different operational modes. In one embodiment, the fluid circulation system can include a heat transfer fluid diversion and heating system 200 provided between the assembly of the PVT cell 10, a portion of the PVT cell inlet-side pipe 85, the at least one in-cell pipe 5, and a portion of the PVT cell outlet-side pipe 15, and an assembly of the first heat exchange pipe 32 in the heat exchanger 30, a portion of the heat exchanger inlet-side pipe 25, and another portion of the PVT cell inlet-side pipe 85, which is the heat exchanger outlet-side pipe.

The heat transfer fluid diversion and heating system 200 includes a boiler unit 20, which is configured to take in the heat transfer fluid from within the PVT cell outlet-side pipe 15, to heat the heat transfer fluid in some operational modes, and to supply the heat transfer fluid into the heat exchanger inlet-side pipe 25. At least one valve is provided within the heat transfer fluid diversion and heating system 200 includes a boiler unit 20 so that the heat exchange fluid can be circulated through at least two different circulation paths in different operational modes. The at least two different circulation paths include a first circulation path including the at least one in-cell pipe 5, which is a pipe through the PVT cell 10, and the first heat exchange pipe 32, which is a pipe through the heat exchanger unit 30, in which the heat exchange fluid loses heat. The at least two different circulation paths include a second circulation path that includes the at least one in-cell pipe 5, i.e., the pipe through the PVT cell 10, and does not include he pipe through the PVT cell and does not include the first heat exchange pipe 32, i.e., a pipe through the heat exchanger unit 30. The second circulation path can include a heat exchanger bypass pipe 55 or a boiler/cell bypass pipe 45. The boiler unit 20 can include an internal pump (not shown) to facilitate the circulation of the heat transfer fluid.

In one embodiment, the second circulation path can include a heat exchanger bypass pipe 55, and the heat transfer fluid diversion and heating system 200 can include a first valve 28 that is configured to select a circulation path of the heat exchange fluid between a first circulation path including the first heat exchange pipe 32, i.e., a pipe through the heat exchanger unit 30, and a second circulation path that bypasses the first heat exchange pipe 32 and directs the flow of the heat transfer fluid into the heat exchanger bypass pipe 55. The first valve 28 can be integrated with the heat exchanger inlet-side pipe 25. The first valve 28 can be a three-way valve.

In one embodiment, the second circulation path can include the heat exchanger bypass pipe 55, and the heat transfer fluid diversion and heating system 200 can include a second valve 18 that is configured to select the circulation path of the heat exchange fluid between one of the first and second circulation paths and a third circulation path that bypasses the boiler unit 20 and the heat exchanger unit 30, and directs the flow of the heat transfer fluid into the boiler/cell bypass pipe 45. The second valve 18 can be integrated with the PVT cell outlet-side pipe 15. In one embodiment, the second valve 18 can be a three-way valve.

Optionally, the heat transfer fluid diversion and heating system 200 can include a third valve 88 located at a common node in the circulation paths of the heat exchange fluid. The third valve 88 can be configured to select one of two inlets that are located at one end of a portion of the PVT cell inlet-side pipe 85 or an end of the boiler/cell bypass pipe 45, respectively. The third valve 88 can be a three-way valve. The portion of the PVT cell inlet-side pipe 85 is connected to an outlet of the heat exchanger unit 30, i.e., the outlet of the first heat exchange pipe 32, and the boiler/cell bypass pipe 45 is connected to an outlet of the second valve 18, respectively. Further, the outlet side of the third valve 88 is connected to an inlet of the PVT cell 10, i.e., the inlet side(s) of the at least one in-cell pipe 5.

Electricity generated from the PVT cell 10 is transferred to an electricity storage device 94, which can be a set of at least one capacitors or any other electricity-storing device known in the art, through a first set of conductive wires 92. The electricity stored in the electricity storage device 94 is supplied to an electricity distribution system 99 through a second set of conductive wires 96. The electricity distribution system 99 can be any system that is capable of distributing electricity stored in the electricity storage device 94 as known in the art. Optionally, a third set of conductive wires 97 can be provided to power the boiler unit 20, and/or any of the circulation pump 60, a water supply pump 70, and/or an optional control device 22. The control device 22 can be any type of controller known in the art configured for automatic control, and can be embodied in a personal computer, an enterprise server, a mobile device, or a wireless remote control device receiving data and providing instructions.

In one embodiment, the control device 22 can be provided to control the operation of the heat transfer fluid diversion and heating system 200 and/or to monitor the temperature of at least one part of the PVT cell 10. In one embodiment, a temperature sensor can be placed within the PVT cell 10 to monitor the temperature of a photovoltaic material that includes a p-n junction and located on the front side of the PVT cell 10 that is irradiated by a light source, such as the sun. Optionally, another temperature sensor can be placed directly on the at least one in-cell pipe 5 within the PVT cell to monitor the temperature of the heat transfer fluid within the PVT cell 10. The temperature sensors can be any electronic circuit known in the art.

In one embodiment, the heat exchange fluid can be distilled water, and the boiling point of the heat exchange fluid can be substantially the same as 100 degree Celsius (with a variation coming from changes in the atmospheric pressure or the pressure that the distilled water is subjected to). In another embodiment, the heat exchange fluid can be a liquid different from water. For example, the heat exchange fluid can be glycol or a mixture of distilled water and glycol.

Figure 2A:
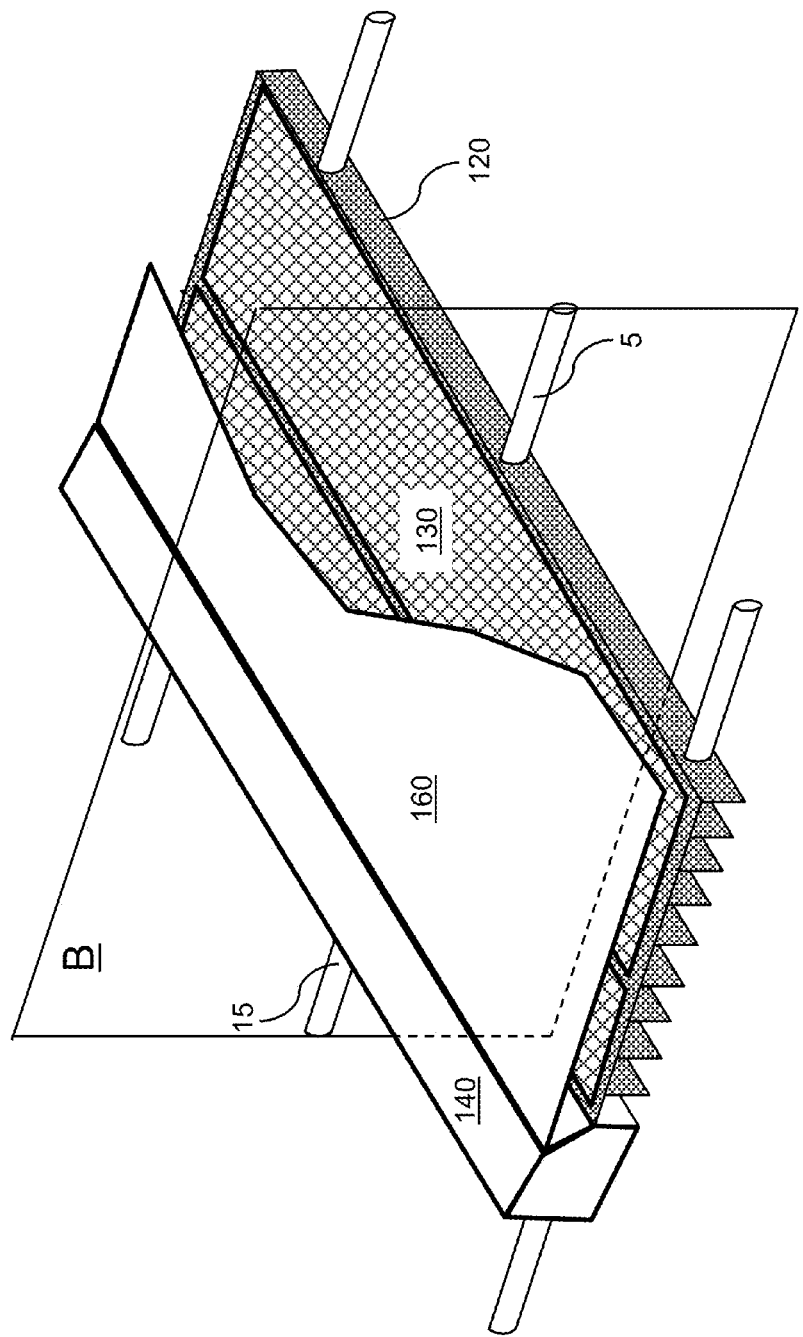
FIG. 2A is a bird's eye view of an upper portion of an exemplary photovoltaic thermal cell that can be employed in the exemplary photovoltaic thermal system of FIG. 1 according to an embodiment of the present disclosure.
Figure 2B:
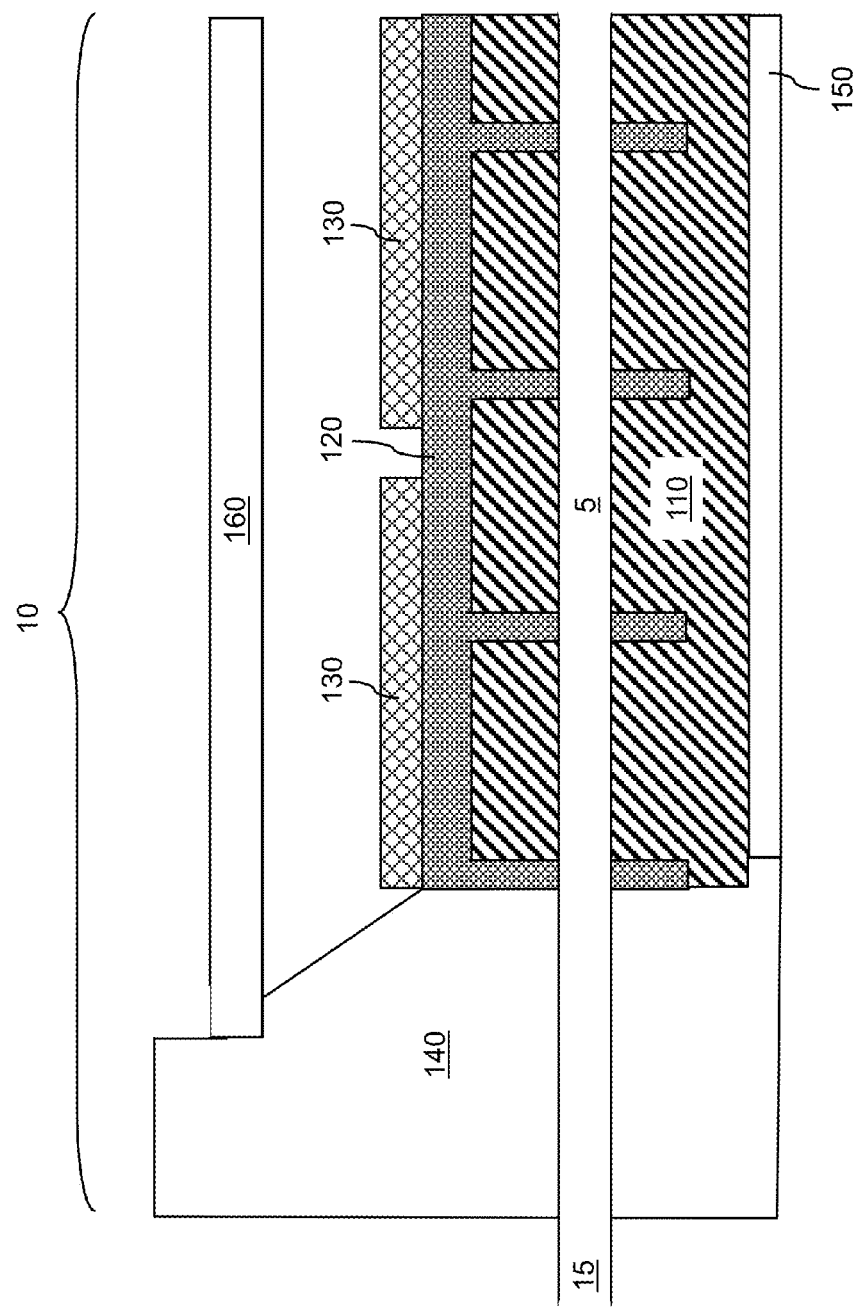
FIG. 2B is a vertical cross-sectional view of the exemplary photovoltaic thermal cell of FIG. 2A along the plane B according to an embodiment of the present disclosure.

Details of a magnified region M in FIG. 1 are illustrated in FIGS. 2A and 2B. FIG. 2A is a bird's eye view of an upper portion of an exemplary PVT cell 10 in the exemplary photovoltaic thermal system of FIG. 1, and FIG. 2B is a vertical cross-sectional view of the exemplary PVT cell 10 of FIG. 2A along the plane B in FIG. 2A.

The exemplary PVT cell 10 includes an insulator substrate 110. The insulator substrate 110 includes an insulator material, which can be, for example, plastics (such as polyurethane) or any other insulator material known in the art. The thickness of the insulator substrate 110 is selected to provide sufficient mechanical strength to support a finned thermally conductive structure 120 and a photovoltaic material layer 130 as well as at least one in-cell pipe 5 that passes through the insulator substrate 110. For example, the thickness of the insulator substrate 110 can be from 0.5 cm to 10 cm.

The finned thermally conductive structure 120 can be formed on the insulator substrate by forming parallel grooves and subsequently filling the parallel grooves with a conductive material such as aluminum or copper. Each of the parallel grooves in the insulator substrate 110 is filled with a conductive fin. The conductive fins and an overlying planar conductive material layer are formed as an integral structure, which constitutes the finned thermally conductive structure 120.

The exemplary PVT cell 10 further includes a photovoltaic material layer 130, which includes a photovoltaic material having a p-n junction therein. The photovoltaic material layer 130 can be formed, for example, by deposition of at least one photovoltaic material on the top surface of the finned thermally conductive structure 120. The photovoltaic material can includes any material that is subject to degradation in the electrical output efficiency, which is the percentage of the generated electrical power relative to the power of the incident radiation (e.g., the power of the impinging solar radiation). The at least one photovoltaic material can be deposited, for example, by chemical vapor deposition (PVD), physical vapor deposition (PVD), vacuum evaporation, or any other known semiconductor material deposition method known in the art. Electrical wiring (not shown) is provided on the photovoltaic material layer 130 to collect electricity generated in the photovoltaic material. Optionally, the photovoltaic material layer 130 can be patterned, for example, by lithographic methods and an etch, to provide multiple laterally spaced portions of the photovoltaic material layer 130. The physical contact between the top surface of the finned thermally conductive structure 120 and the photovoltaic material layer 130 increases the heat transfer from the photovoltaic material layer 130 to the finned thermally conductive structure 120 to enhance the thermal output of the exemplary PVT cell 10.

In one embodiment, the photovoltaic material can include an amorphous semiconductor material. The amorphous semiconductor material can be amorphous silicon, amorphous germanium, an amorphous silicon-germanium alloy, amorphous gallium arsenide, amorphous indium arsenide, amorphous gallium-indium arsenide, amorphous cadmium telluride (CdTe), amorphous copper indium diselenide ($CuInSe_2$, or CIS), or any other amorphous semiconductor material known to generate electricity at a p-n junction. The photovoltaic material can be hydrogenated, i.e., includes hydrogen therein. In one embodiment, the photovoltaic material can be hydrogenated amorphous silicon. Any p-n junction structure known in the art can be employed within the photovoltaic material layer 130.

The exemplary PVT cell 10 further includes a frame 140. The frame 140 provides a lateral structural support to the insulator substrate 110. In one embodiment, the frame 140 can surround the insulator substrate 110. The frame 140 can be structurally connected to the insulator substrate 110 by any mechanical means known in the art including a screw, a bolt, an adhesive material, tight fit, spring, construction as a unitary (single) structure, etc. The frame 140 includes an insulator material, which can be, for example, plastics (such as polyurethane) or any other insulator material known in the art.

A lid 160 is provided over the photovoltaic material layer 130. The lid 160 is optically transparent to let in the radiation in the wavelength range of the electromagnetic radiation at which the photovoltaic material layer 130 can generate electricity. Optionally, surface texturing can be employed on the front and/or back surface of the lid 160 to trap radiation that impinges onto the front surface (top surface) of the lid within the cavity between the photovoltaic material layer 130 and the back surface of the lid 160.

In one embodiment, the lid 160 can be a variable configuration lid, i.e., a lid that has at least two different configurations between, or among, which the lid can move. The at least two different configurations of the variable configuration lid provide a different level of thermal trapping for the air between the front surface of the photovoltaic material layer 130 and the back surface of the lid 160. For example, the air between the front surface of the photovoltaic material layer 130 and the back surface of the lid 160 can be trapped in a sealed volume in one of the at least two different configurations, and is ventilated in at least another of the at least two different configurations.

Optionally, a backside structure 150 can be provided. The backside structure can be connected to the insulator substrate 10 and/or the frame 140, and can provide additional thermal insulation and/or a mechanism for mounting and/or moving the exemplary PVT cell 10.

At least one in-cell pipe 5 is configured to pass through, and contact, the fins of the finned thermally conductive structure 120. The physical contact between the fins of the finned thermally conductive structure 120 and the at least one in-cell pipe 5 provides a thermally conductive path, through which the heat collected in the photovoltaic material layer 130 and the finned thermally conductive structure 130 is transferred into the heat transfer fluid that passes through the at least one in-cell pipe 5. In addition, as will be explained below, the he physical contact between the fins of the finned thermally conductive structure 120 and the at least one in-cell pipe 5 provides a thermally conductive path, through which the heat in the heat transfer fluid in the at least one in-cell pipe 5 is transferred to the photovoltaic material in the photovoltaic material layer 130 during an anneal at an elevated temperature in order to restore the electrical output efficiency of the photovoltaic material.

Figure 3:
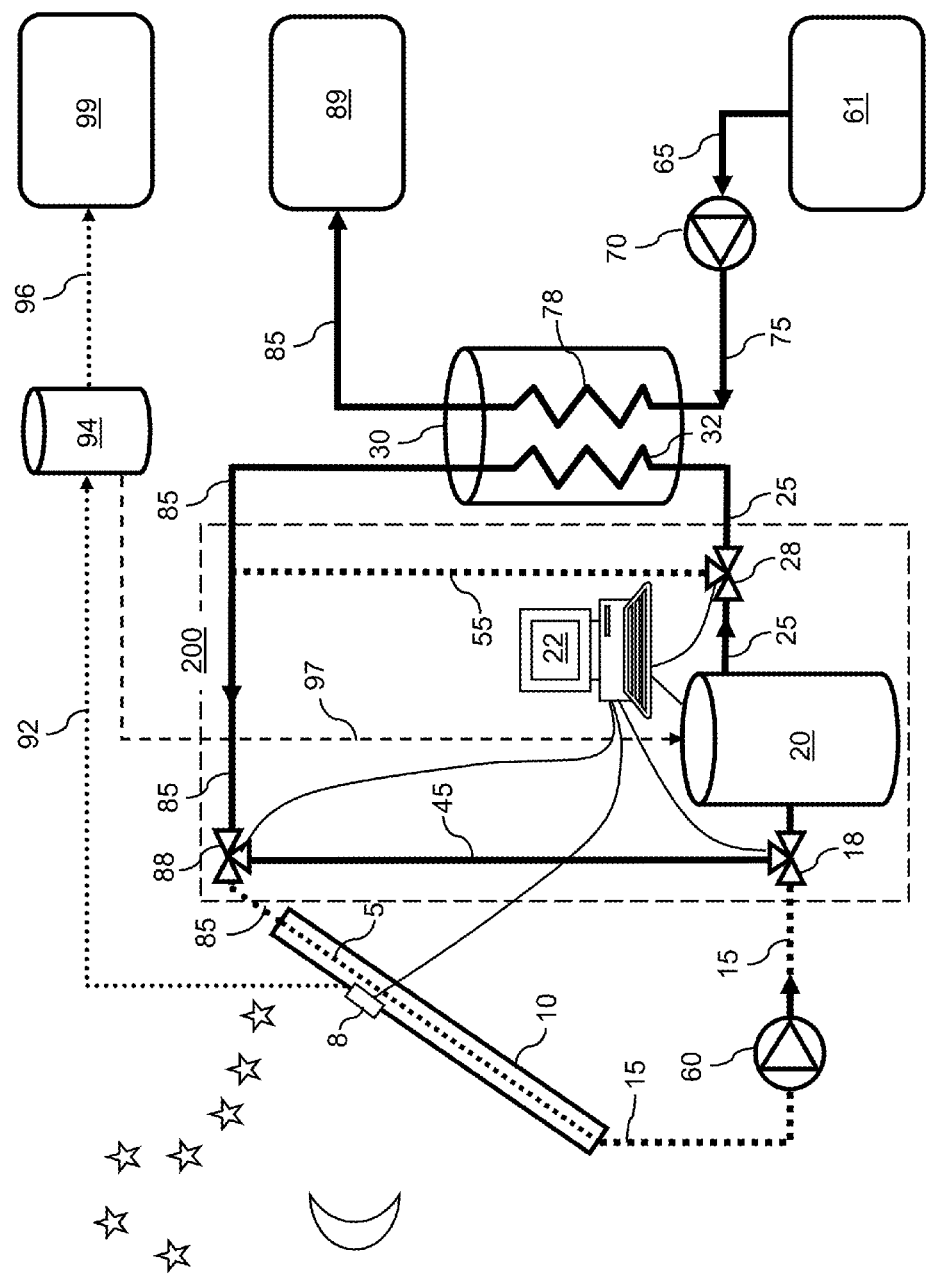
FIG. 3 is a schematic diagram of the exemplary photovoltaic thermal system of FIG. 1 in a boiler unit-driven heat supply mode according to an embodiment of the present disclosure.

Referring to FIG. 3, the operation of the exemplary PVT system of FIG. 1 in a boiler unit-driven heat supply mode is illustrated. In the boiler unit-driven heat supply mode, the heat needed to operate the exemplary PVT system is provided by the boiler unit 20, i.e., the boiler unit 20 is employed as the driver for the heat supply to the exemplary PVT system. The boiler unit-driven heat supply mode can be employed when the thermal output from the PVT cell 10 is too low to be utilized, e.g., at night.

The boiler unit 20 heats the heat transfer fluid, which is circulated though the heat exchanger inlet-side pipe 25 and the first valve 28 thereupon, the first heat exchange pipe 32 within the heat exchanger 30, a portion of the PVT cell inlet-side pipe 85 up to the third valve 88, the boiler/cell bypass pipe 45, the second valve 18, and a portion of the PVT cell outlet-side pipe 15 between the second valve 18 and the boiler unit 20. Thus, the boiler unit 20 provides heat to the heat exchanger 30 in the boiler unit-driven heat supply mode without the assistance of a thermal output from the PVT cell 10.

The temperature of the PVT cell 10 and various portions of the at least one in-cell pipe 5, the PVT cell inlet-side pipe 85, and the PVT cell outlet-side pipe 15 can be monitored by the control device 22. If the temperature of the heat transfer fluid approaches the freezing point for the heat transfer fluid, e.g., 0 degree Celsius in the case of distilled water, the circulation path of the heat transfer fluid can be temporarily modified, employing the various valves (18, 28, 88) to flow a heated portion of the heat transfer fluid into the section of the various pipes (5, 15, 85, 55) and to prevent the freezing of the heat transfer fluid. Such temporary alterations of the circulation path in order to prevent freezing of the heat transfer fluid (e.g., in winter nights) are herein referred to as "anti-freezing cycles."

Figure 4:
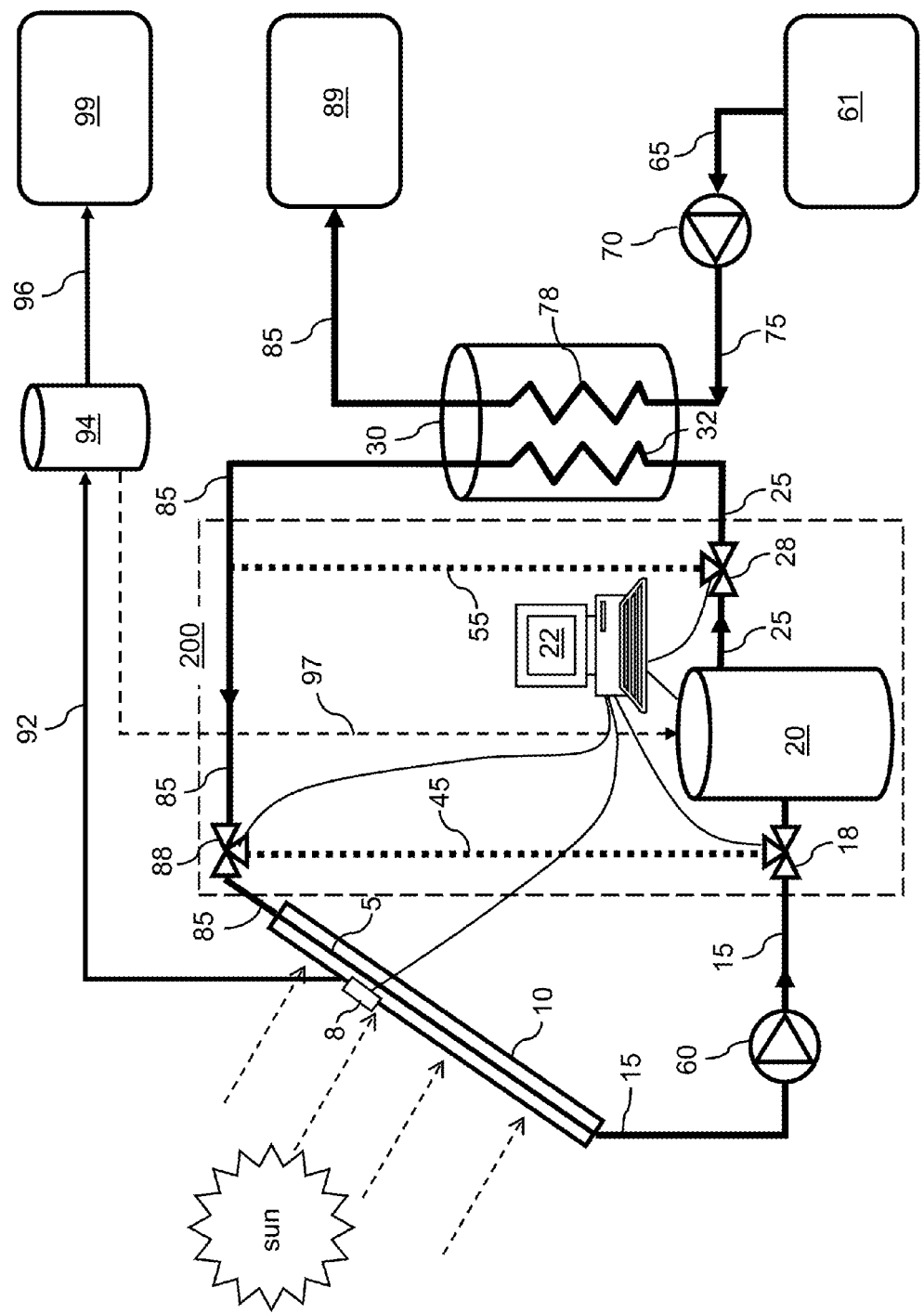
FIG. 4 is a schematic diagram of the exemplary photovoltaic thermal system of FIG. 1 in a photovoltaic thermal operational mode.

Referring to FIG. 4, the operation of the exemplary PVT system of FIG. 1 in a photovoltaic thermal operational mode is illustrated. In the photovoltaic thermal operational mode, a light source (such as the sun) provides sufficient energy to generate electricity and a thermal output from the PVT cell 10. The photovoltaic thermal operational mode is the mode in which the power of the radiation impinging on the PVT cell 10 is best utilized. The electricity is routed to the electricity storage device 94 and the electricity distribution system 99. The thermal output is transferred, in the form of the heat carried by the heat transfer fluid exiting the at least one in-cell pipe 50, to the heat exchanger 30. The circulation path of the heat transfer fluid in the photovoltaic thermal operational mode, which is herein referred to as a first circulation path, includes the at least one in-cell pipe 5, the PVT cell outlet-side pipe 15 and the second valve 18 thereupon, the boiler unit 20, the heat exchanger inlet-side pipe 25 and the first valve 28 thereupon, the first heat exchange pipe 32, and the PVT cell inlet-side pipe 85.

Because the electrical output efficiency of the PVT cell 10 is negatively impacted at elevated temperatures, the temperature of the PVT cell 10 can be monitored and adjustments can be made to the lid 160 (See FIGS. 2A and 2B) to provide some ventilation to the front surface of the photovoltaic material layer 130 of the PVT cell 10. In one embodiment, the lid 160 is not fully opened so that a significant fraction of the radiation reflected off the surface of the photovoltaic material layer 130 can be trapped between the back surface of the lid 160 and the front surface of the photovoltaic material layer 130. The degree of partial opening of the lid 160 can be controlled by the control device 22 based on a preprogrammed algorithm for enhancing the electrical output efficiency as a function of temperature and the degree of light trapping for the light reflected off the surface of the photovoltaic material layer 130.

Use of the exemplary PVT system results in degradation of the electrical output efficiency as discussed above. Thus, a procedure for restoring the electrical output efficiency of the PVT cell 10 is performed employing the heat transfer fluid diversion and heating system 200.

Figure 5:
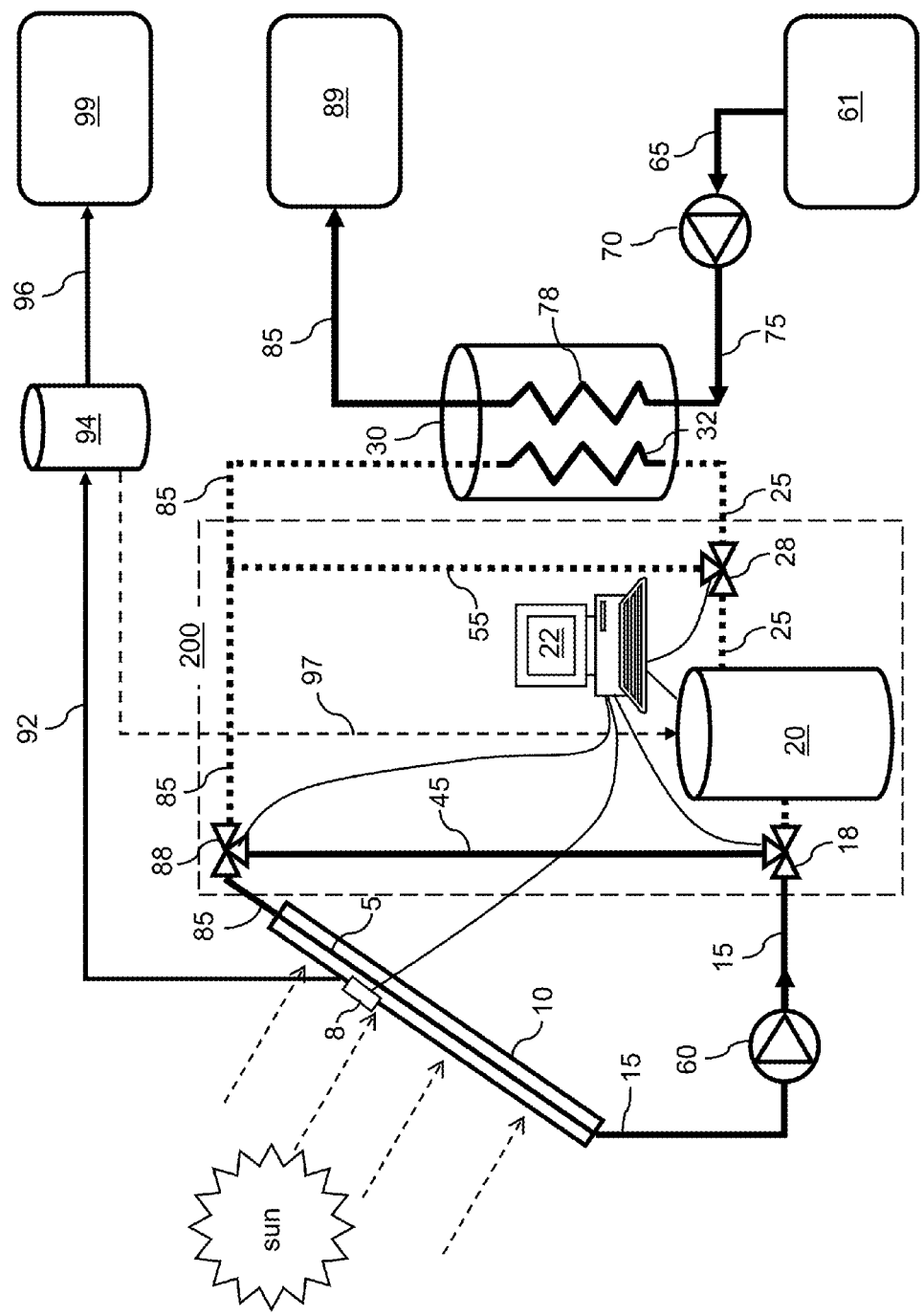
FIG. 5 is a schematic diagram of the exemplary photovoltaic thermal system of FIG. 1 in a preliminary heat exchange fluid heating mode according to an embodiment of the present disclosure.

In one embodiment, the procedure for restoring the electrical output efficiency can be a two-step process. Referring to FIG. 5, a preliminary heat exchange fluid heating mode can be employed during the first step of the electrical output efficiency restoration procedure.

In the preliminary heat exchange fluid heating mode, the second valve 28 and the third valve 88 are actuated such that the heat exchange fluid in the at least one in-cell pipe 5 is circulated through a circulation path, which is herein referred to as a third circulation path. The third circulation path includes the at least one in-cell pipe 5, the PVT cell outlet-side pipe 15, the boiler/cell bypass pipe 45, and a portion of the PVT cell inlet-side pipe 85 between the third valve 88 and the at least one in-cell pipe 5. Thus, the third valve 88 accepts an influx of the heat exchange fluid from an outlet of the second valve 28 during the preliminary heat exchange fluid heating mode.

The thermal output from the PVT cell 10 is then employed to heat the heat transfer fluid that is confined within the third circulation loop, which does not include any heat exchanger. The temperature of the heat transfer fluid within the third circulation loop rises until the heat loss to the ambient from the surfaces of the pipers (5, 15, 45, 85), valves (18, 88), the circulation pump 60, and the PVT cell 20 equals the thermal output of the PVT cell 10. The equilibrium temperature at which the temperature of the heat transfer fluid stabilizes in the preliminary heat exchange fluid heating mode depends on the configuration of the physical implementation of a PVT system, and can be about 72 degrees Celsius in a typical installation.

Once the temperature of the heat transfer fluid approaches the equilibrium temperature (e.g., within 5 degrees), a second step of the procedure for restoring the electrical output efficiency can be initiated. In the second step, the PVT system operates in an anneal mode, in which the boiler unit 20 and optionally changes in the geometry of the lid 160 (See FIGS. 2A and 2B) can be employed to provide additional heating to the photovoltaic material in the photovoltaic material layer 130 in the PVT cell 10.

In the anneal mode, the boiler unit 20 heats the heat transfer fluid further. The second valve 28 and the third valve 88 are actuated such that the heat exchange fluid in the at least one in-cell pipe 5 is circulated through a different circulation path, which is herein referred to as a second circulation path. The second circulation path includes the at least one in-cell pipe 5, the PVT cell outlet-side pipe 15, the boiler unit 20, a portion of the heat exchanger inlet-side pipe 25 up to the first valve 28, the heat exchanger bypass pipe 55, and a portion of the PVT cell inlet-side pipe 85 between an end of the heat exchanger bypass pipe 55 and the at least one in-cell pipe 5. Thus, the third valve 88 accepts an influx of the heat exchange fluid that comes out of the boiler unit 20 during the anneal mode.

The combination of the thermal output from the PVT cell 10 and the additional heat provided at the boiler unit 20 is employed to heat the heat transfer fluid that is confined within the second circulation loop, which does not include any heat exchanger. The temperature of the heat transfer fluid within the second circulation loop rises to the boiling point of the heat transfer fluid, which is substantially 100 degrees Celsius in the case of distilled water.

The local temperature of the photovoltaic material within the photovoltaic material layer 130 (See FIGS. 2A and 2B) of the PVT cell can be elevated above the boiling temperature of the heat transfer fluid because the thermal conductivity of the material of the finned thermally conductive structure 120, while good, is not infinite.

In one embodiment, the temperature of the photovoltaic material in the photovoltaic material layer 130 of the PVT cell 10 is raised above the boiling point of the heat exchange fluid during the annealing. Various means can be employed to provide additional local heating of the photovoltaic material. In the case of hydrogenated amorphous silicon, the electrical output efficiency can be restored to a maximum level in a temperature range from 130 degrees Celsius to 200 degrees Celsius. The required duration of anneal required to fully restore the electrical output efficiency decreases with the temperature of the anneal. For example, an anneal of a few hours is needed at about 130 degrees Celsius, while an anneal for 1 minute is needed at about 200 degrees Celsius. In an embodiment in which the photovoltaic material is hydrogenated amorphous silicon, the photovoltaic material in the photovoltaic material layer 130 of the PVT cell 10 can be heated to a temperature greater than 130 degrees Celsius for a duration of time, which can be, for example, from 1 minute to several hours depending on the temperature of the anneal.

Figure 6:
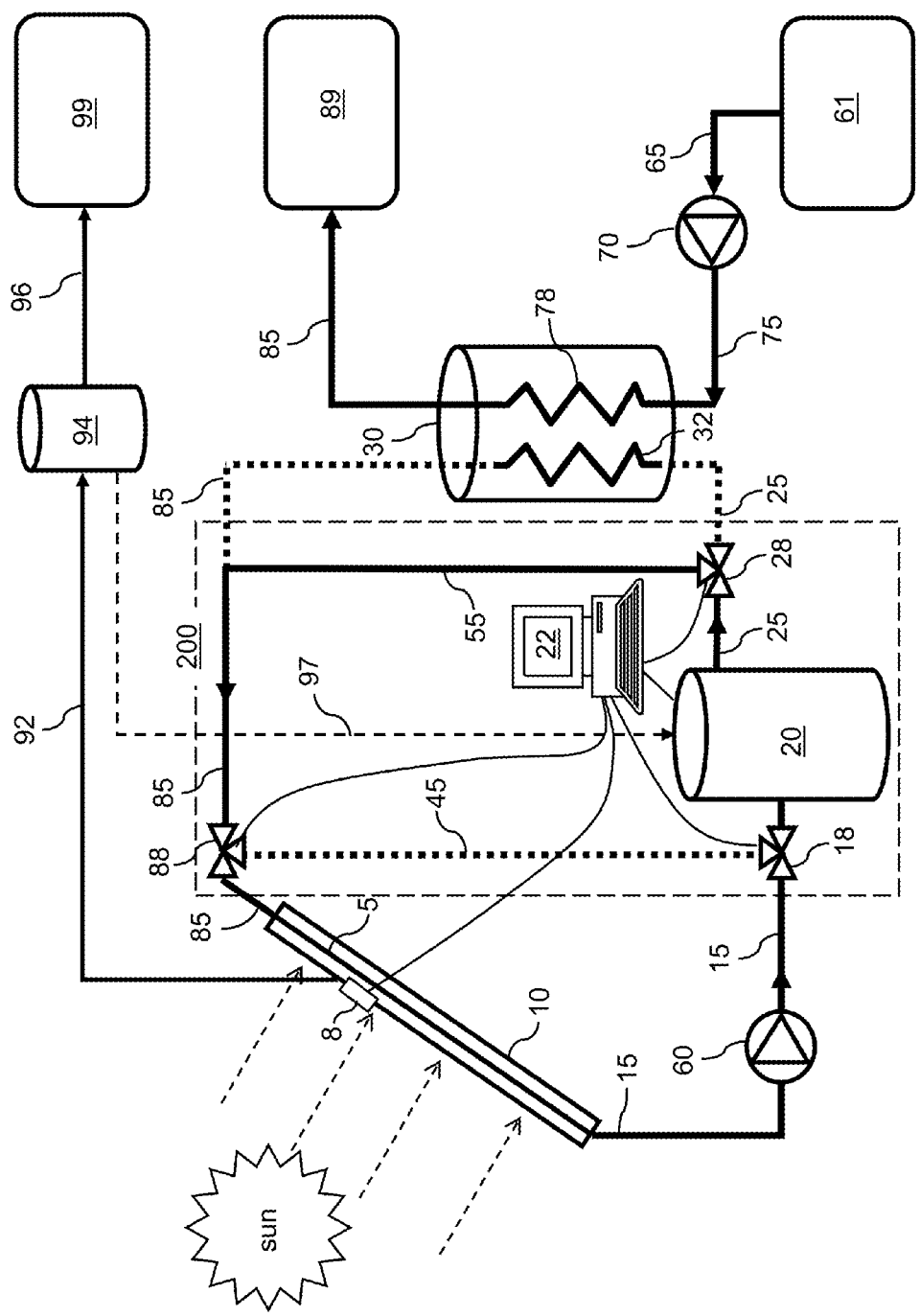
FIG. 6 is a schematic diagram of the exemplary photovoltaic thermal system of FIG. 1 in an anneal mode according to an embodiment of the present disclosure.

In one embodiment, the procedure for restoring the electrical output efficiency can be a one-step process in which the preliminary heat exchange fluid heating mode in the two-step process is omitted. In other words, the procedure for restoring the electrical output efficiency can employ a single step anneal process employing the configuration shown in FIG. 6.

In one embodiment, the lid 160 (See FIGS. 2A and 2B) can be a variable configuration lid. The PVT system can operate in the photovoltaic thermal operational mode, which is an operational mode that generates the thermal output, while a variable configuration lid on the PVT cell is in one position, and then, during the anneal mode, the position of the variable configuration lid can be changed to a different position in order to increase heat trapping within a confined space between the back side of a lid 160 and the front surface of the photovoltaic material layer 130.

Figure 7:
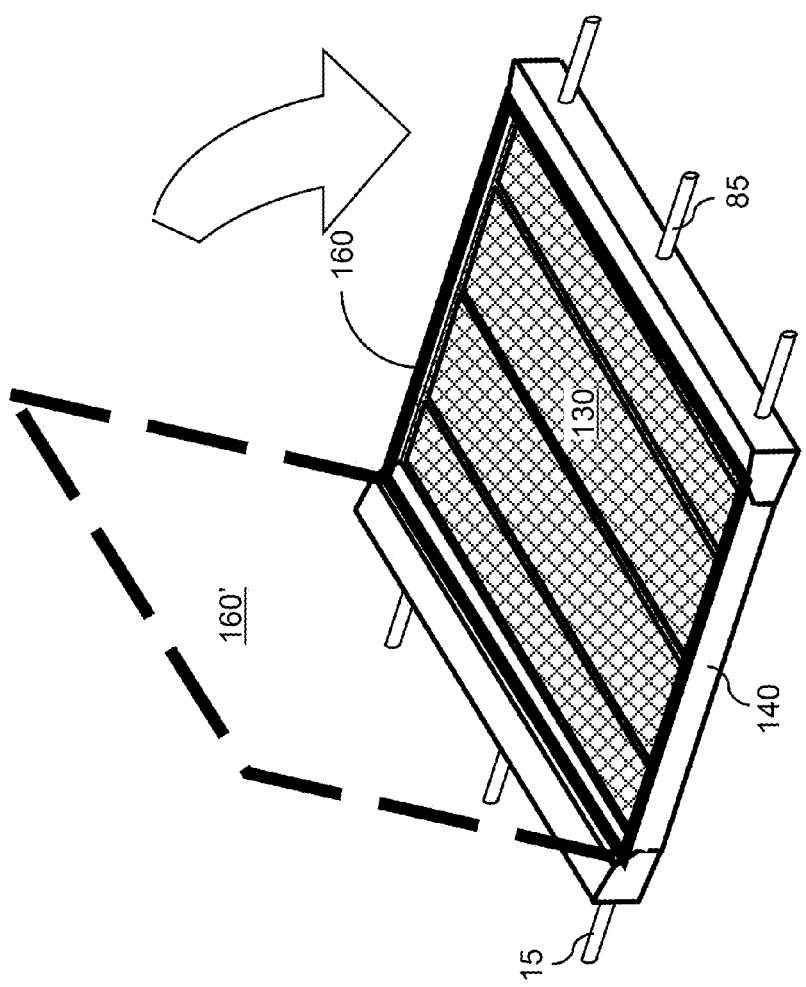
FIG. 7 is a first exemplary structure of a photovoltaic thermal cell having a variable configuration lid according to an embodiment of the present disclosure.

Referring to FIG. 7, a first exemplary structure of a PVT cell 10 having a variable configuration lid 160 is illustrated. The variable configuration lid 160 can be attached to a body of the PVT cell 10 by a hinge around which the variable configuration lid 160 can rotate. A dotted silhouette 160' represents an alternate position in which the variable configuration lid 160 can be placed in the photovoltaic thermal operational mode illustrated in FIG. 4. Prior to the anneal, the variable configuration lid 160 can be rotated, for example, by employing an actuation mechanism such as a combination of a motor and gears (not shown) that is controlled by the control device 22 (See FIG. 1). The front surface of the PVT cell 19 is less ventilated during the annealing than during the photovoltaic thermal operational mode. In one embodiment, a confined volume encapsulated by the surfaces of the front side of the photovoltaic material layer 130 and sidewalls of the frame 140 and the variable configuration lid 160 can be formed during the annealing, which increases the local temperature of the photovoltaic material of the photovoltaic material layer 130 above the boiling point of the heat exchange fluid.

Figure 8:
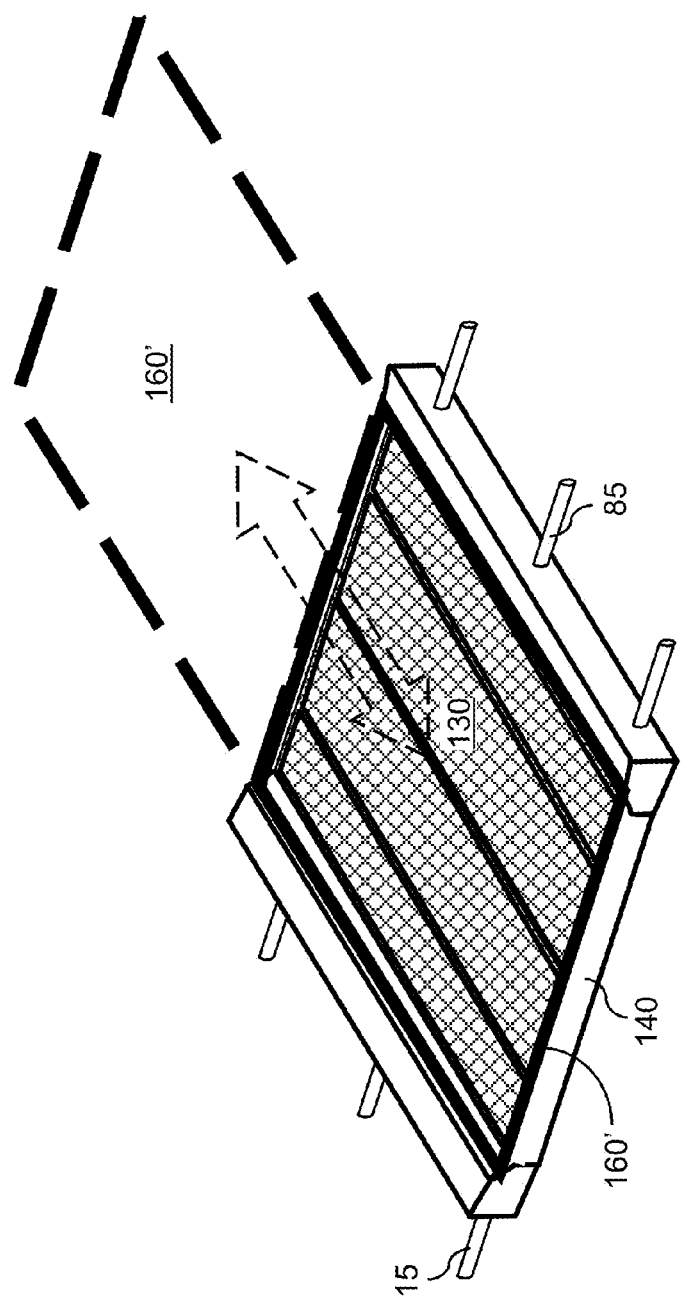
FIG. 8 is a second exemplary structure of a photovoltaic thermal cell having a variable configuration lid according to an embodiment of the present disclosure.

Referring to FIG. 8, a second exemplary structure of a PVT cell 10 having a variable configuration lid 160 is illustrated. The variable configuration lid 160 can be configured to slide in a plane that is substantially parallel to the front surface of the PVT cell 10. A dotted silhouette 160' represents an alternate position in which the variable configuration lid 160 can be placed in the photovoltaic thermal operational mode illustrated in FIG. 4. Prior to the anneal, the variable configuration lid 160 can be slid in the plane, for example, by employing an actuation mechanism such as a combination of a motor, a rack, and a pinion (not shown). The actuation mechanism can be controlled by the control device 22 (See FIG. 1). The front surface of the PVT cell 19 is less ventilated during the annealing than during the photovoltaic thermal operational mode. In one embodiment, a confined volume encapsulated by the surfaces of the front side of the photovoltaic material layer 130 and sidewalls of the frame 140 and the variable configuration lid 160 can be formed during the annealing, which increases the local temperature of the photovoltaic material of the photovoltaic material layer 130 above the boiling point of the heat exchange fluid.

Figure 9:
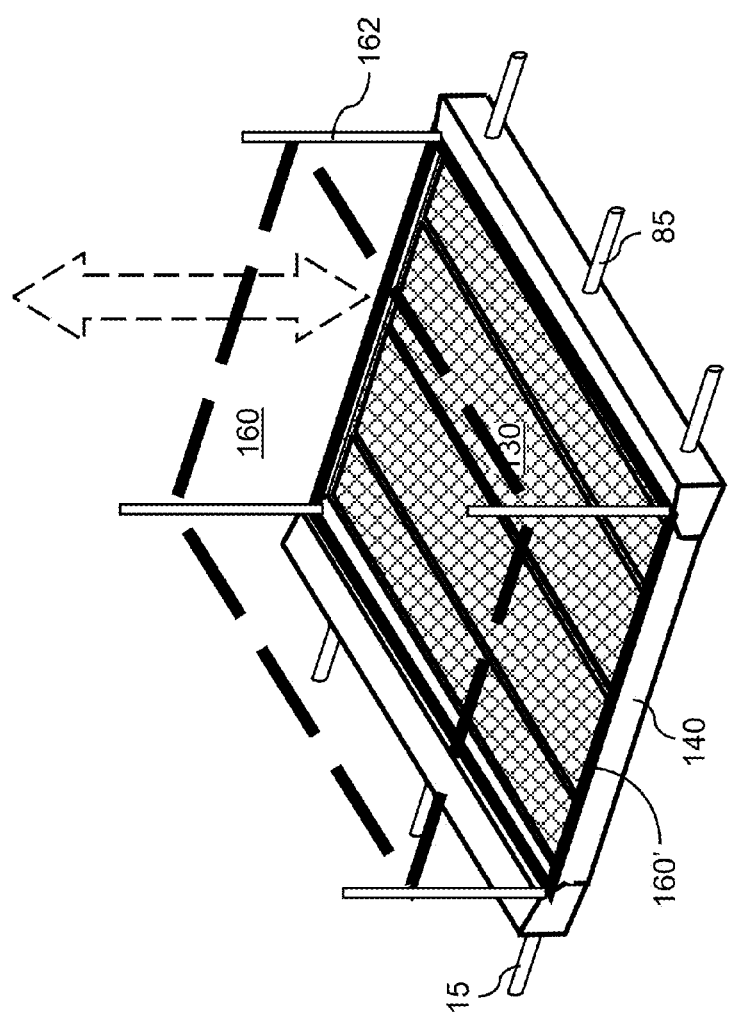
FIG. 9 is a third exemplary structure of a photovoltaic thermal cell having a variable configuration lid according to an embodiment of the present disclosure.

Referring to FIG. 9, a third exemplary structure of a PVT cell 10 having a variable configuration lid 160 is illustrated. The variable configuration lid 160 can be configured to move in a direction substantially perpendicular to the front surface of the PVT cell 10. A dotted silhouette 160' represents an alternate position in which the variable configuration lid 160 can be placed in the photovoltaic thermal operational mode illustrated in FIG. 4. Prior to the anneal, the variable configuration lid 160 can be moved in that direction, for example, employing a set of racks 162 configured to move up or down with the rotation of a set of pinions (not shown) connected to one or more motors (not shown) embedded in the frame 140. The front surface of the PVT cell 19 is less ventilated during the annealing than during the photovoltaic thermal operational mode. In one embodiment, a confined volume encapsulated by the surfaces of the front side of the photovoltaic material layer 130 and sidewalls of the frame 140 and the variable configuration lid 160 can be formed during the annealing, which increases the local temperature of the photovoltaic material of the photovoltaic material layer 130 above the boiling point of the heat exchange fluid.

Figure 10:
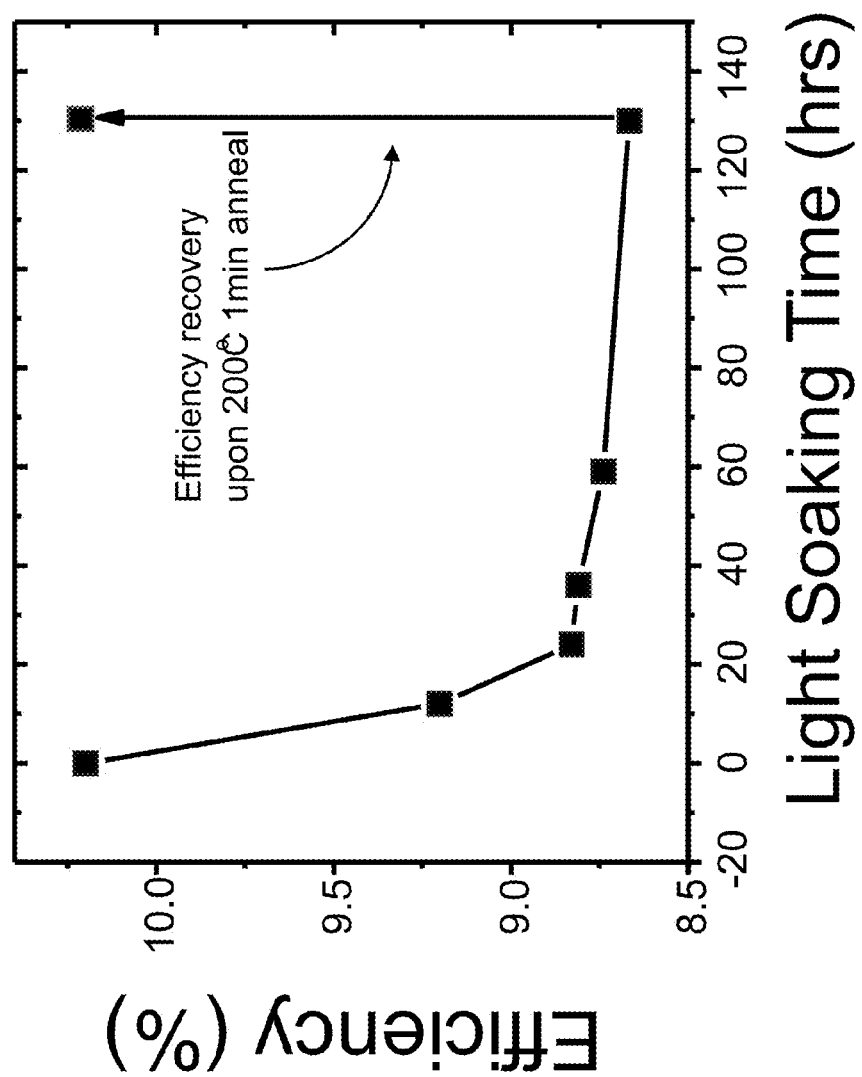
FIG. 10 is a graph illustrating restoration of the electrical output efficiency of a photovoltaic thermal cell of embodiments of the present disclosure.

FIG. 10 illustrate an example of the restoration of the electrical output efficiency, or "efficiency," through an anneal performed at 200 degrees Celsius for 1 minute. By periodically performing an anneal, the electrical output efficiency can be restored back to the initial efficiency level. For example, in the illustrate example of FIG. 10, the anneal can be performed every 10 hours of light soaking time (which can be tracked by the control device 22) to restore the electrical output efficiency of the PVT cell back to 10.2%.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A photovoltaic thermal (PVT) system comprising:
a photovoltaic thermal (PVT) cell configured to generate electricity and to provide a thermal output;
an in-cell pipe located within said PVT cell and configured to transport a heat exchange fluid inside said in-cell pipe;
a boiler unit for heating said heat exchange fluid;
a heat exchanger unit within which said heat exchange fluid loses heat;
a heat exchanger inlet-side pipe connecting said boiler unit to said heat exchanger unit;
a PVT cell inlet-side pipe connecting said PVT cell to said heat exchanger unit;
a PVT cell outlet-side pipe connecting said PVT cell to said boiler unit; and
a heat exchanger bypass pipe connecting said heat exchanger inlet-side pipe to said PVT cell inlet-side pipe,
wherein said PVT system operates in a first circulation path or a second circulation path; a first valve located at a common node between said portion of said heat exchanger inlet-side pipe and said heat exchanger bypass pipe configured to switch between said first circulation path and said second circulation path; said first circulation path transports said heat exchange fluid from said boiler unit to said heat exchanger bypass pipe, from said heat exchanger bypass pipe to said PVT inlet-side pipe, from said PVT inlet-side pipe to said in-cell pipe, from said in-cell pipe to said PVT outlet-side pipe and from said PVT outlet-side pipe back to said boiler unit wherein said boiler unit heats said heat exchange fluid so as to heat a photovoltaic material within said PVT cell to a temperature greater than 130 degrees C. to anneal said photovoltaic material; and said second circulation path transports heat exchange fluid from said PVT cell inlet-side pipe to said in-cell pipe, from said in-cell pipe to said PVT outlet-side pipe, from said PVT outlet-side pipe to said boiler, from said boiler to said heat exchanger inlet-side pipe, from said heat exchanger inlet-side pipe to said heat exchanger unit and from said heat exchanger unit back to said PVT cell inlet-side pipe.

2. The PVT system of claim 1, further comprising an automatic control device configured to provide control instructions to said boiler unit for raising said temperature of said photovoltaic material above 130 degrees C.

3. The PVT system of claim 2, further comprising a temperature sensor located at said PVT cell and configured to measure a temperature of said photovoltaic material of said PVT cell.

4. The PVT system of claim 3, wherein said automatic control device is configured to monitor said measured temperature of said photovoltaic material.

5. The PVT system of claim 3, wherein said automatic control device is programmed to monitor said measured temperature of said photovoltaic material from said temperature sensor and to provide an instruction to heat said heat exchange fluid employing said boiler unit.

6. The PVT system of claim 1, wherein said PVT cell includes a variable configuration lid configured to provide at least two different levels of ventilation over a front surface of said PVT cell.

7. The PVT system of claim 6, wherein said variable configuration lid is attached to a body of said PVT cell by a hinge around which said variable configuration lid can rotate, wherein a rotation of said variable configuration lid provides different levels of ventilation to said front surface of said PVT cell.

8. The PVT system of claim 6, wherein said variable configuration lid is configured to slide in a plane that is substantially parallel to said front surface of said PVT cell, wherein a sliding of said variable configuration lid in said plane provides different levels of ventilation to said front surface of said PVT cell.

9. The PVT system of claim 6, wherein said variable configuration lid is configured to move in a direction substantially perpendicular to said front surface of said PVT cell, wherein a movement of said variable configuration lid in said direction provides different levels of ventilation to said front surface of said PVT cell.

* * * * *